United States Patent [19]

Amendola et al.

[11] Patent Number: 4,552,615
[45] Date of Patent: Nov. 12, 1985

[54] PROCESS FOR FORMING A HIGH DENSITY METALLURGY SYSTEM ON A SUBSTRATE AND STRUCTURE THEREOF

[75] Inventors: Albert Amendola, Hopewell Junction; Arnold F. Schmeckenbecher, Poughkeepsie; Joseph T. Sobon, New Paltz, all of N.Y.

[73] Assignee: International Business Machines Corporation, Armonk, N.Y.

[21] Appl. No.: 612,289

[22] Filed: May 21, 1984

[51] Int. Cl.⁴ .............................................. H05K 3/14
[52] U.S. Cl. .................................. 158/659.1; 29/851; 264/61; 156/664; 156/666; 156/901; 427/96; 427/99
[58] Field of Search .............. 264/61; 29/851; 427/96, 427/99; 156/901, 659.1, 664, 666

[56] References Cited

U.S. PATENT DOCUMENTS

| 3,968,193 | 7/1976 | Langston | 264/61 |
| 4,206,254 | 6/1980 | Schmeckenbecher | 427/99 |
| 4,374,457 | 2/1983 | Wieck | 29/840 |
| 4,430,365 | 2/1984 | Schaible | 427/96 |
| 4,442,137 | 4/1984 | Kumar | 427/96 |

*Primary Examiner*—John D. Smith
*Attorney, Agent, or Firm*—Wolmar J. Stoffel

[57] ABSTRACT

A process for forming a top surface metallurgy pattern on a green unsintered ceramic substrate including the steps of forming indented lines on the surface of the substrate, sintering the substrate, depositing a blanket layer over the top surface of the substrate with a thickness less than the depth of the indented lines, applying a masking layer over the metal layer, removing the masking layer over all portions except the indented lines, removing the exposed areas of the metal layer, and removing the remaining portions of the masking layer.

18 Claims, 4 Drawing Figures

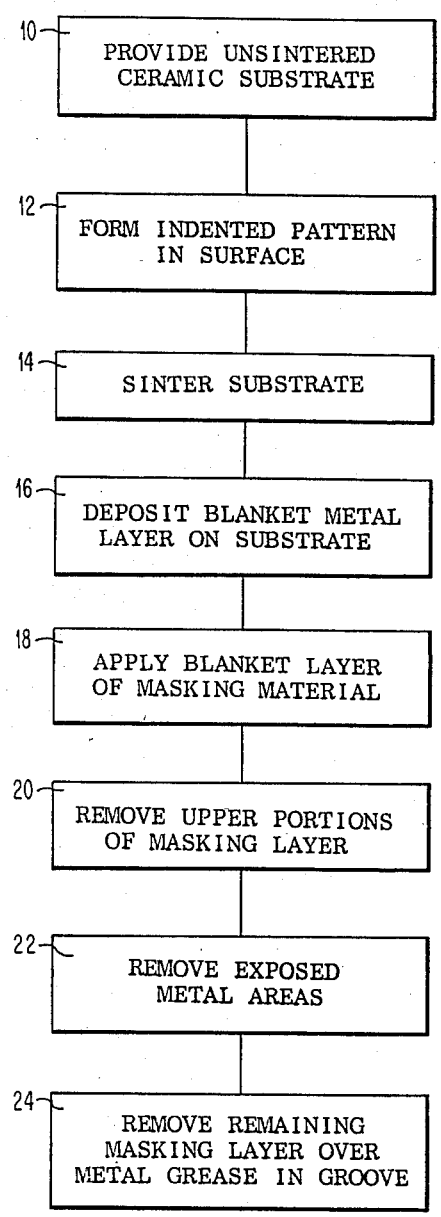
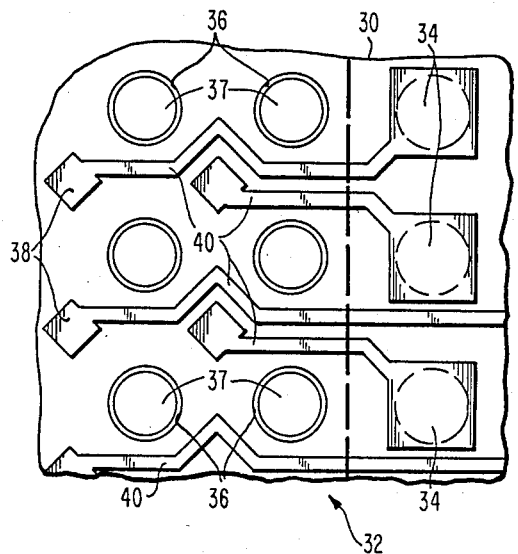
FIG. 2
FIG. 1

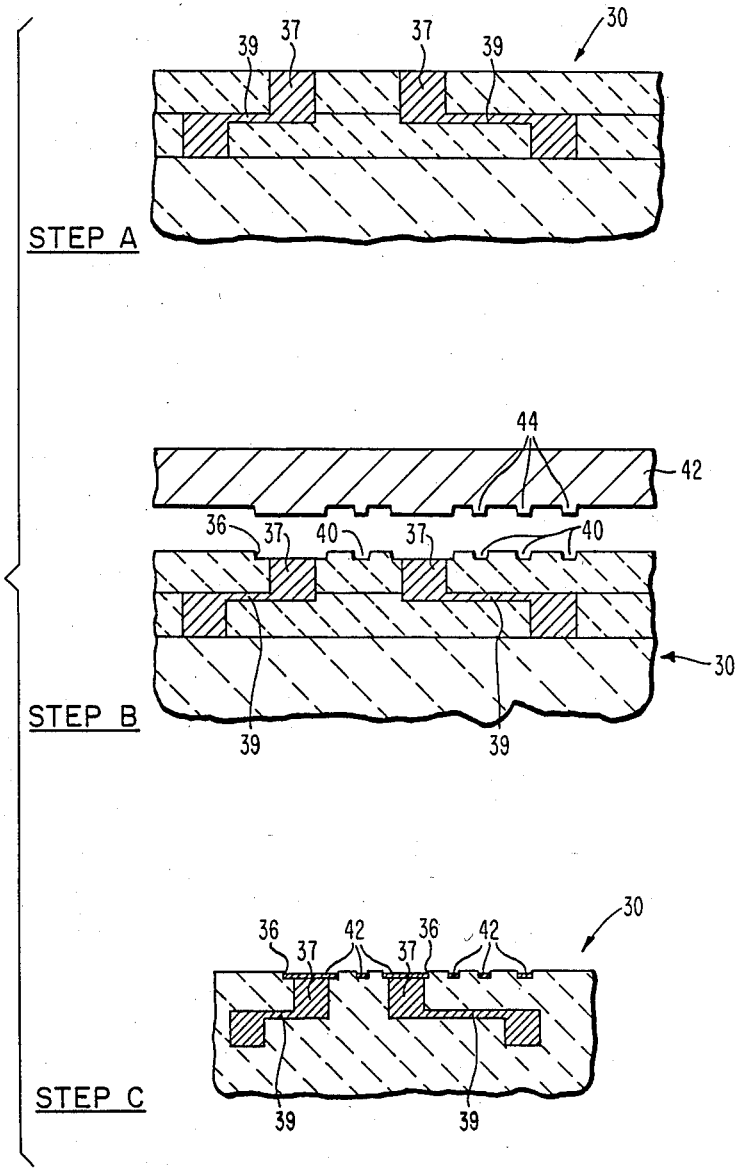

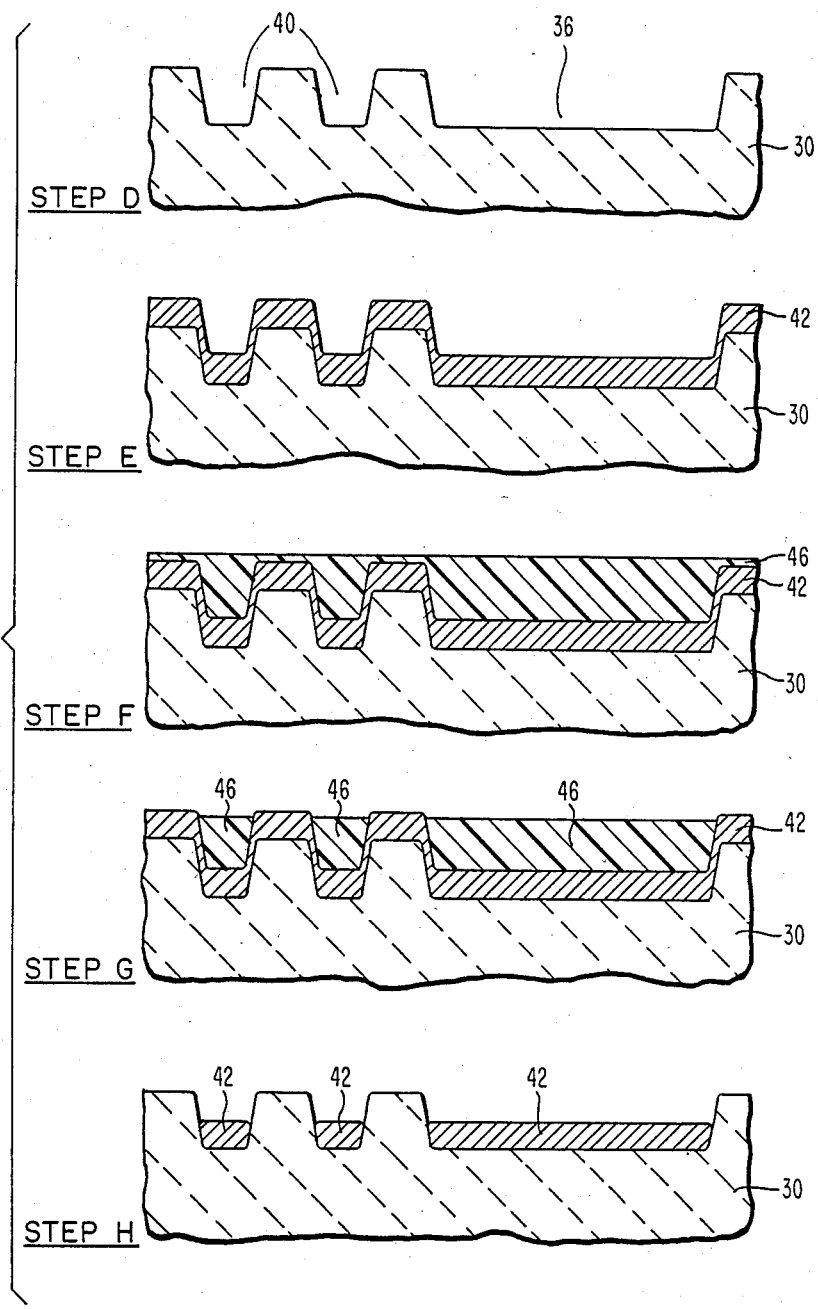

PROCESS FOR FORMING A HIGH DENSITY METALLURGY SYSTEM ON A SUBSTRATE AND STRUCTURE THEREOF

TECHNICAL FIELD

This invention relates to forming metallurgy interconnection systems for dielectric substrates for semiconductor packages, and more particularly for the forming of a high density fan out pattern on a multi-layer ceramic substrate.

Future semiconductor packages will be required to mount many highly integrated semiconductor devices, each with hundreds of circuits, on a single substrate, and interconnect these devices into an operative system. This will require that the area of the package substrate be significantly increased, as compared to present single and multiple device package substrates now in common usage, that the wiring density be increased, and that many closely spaced bonding terminals for connections to the semiconductor devices be provided. A structure that can potentially meet future high density package requirements is a multi-layer ceramic substrate. This structure is described in detail in U.S. Pat. No. 4,245,273. In this substrate the metallurgy is buried within the substrate, making possible very complex and intricate wiring interconnections. The basic process consists of forming a ceramic slurry of particulate ceramic material, a resin binder, and a solvent for the binder, doctor blading the slurry and drying to produce ceramic green sheets, punching holes in and screening conductive lines on the green sheets, laminating the sheets, and sintering.

Integrated circuit devices are becoming increasingly more dense and larger, thereby necessitating more terminals that are increasingly more densely spaced. In conventional multilayer ceramic substrates, using solder bonding techniques, the top sheet has a punched via configuration matching the terminal configuration of the semiconductor device. The fan out of metallurgy lines is done in the several underlying layers. However, when the via holes are closely spaced, cracks may develop between the vias during sintering due to the differential coefficient of expansion rates of the conductive material in the vias and the ceramic material of the substrate. This presents a yield loss, or if no initial short occurs, it presents a future potential problem. In addition, the large number of closely spaced terminals require increasingly large numbers of underlying layers to provide the metallurgy line fan out function, which adds a significant cost factor to the substrate.

It is known to provide a surface metallurgy fan out pattern, complete with terminals on the top surface of the substrate, as suggested by U.S. Pat. No. 3,968,193. This surface metallurgy system consisting of one or more layers may be provided by screening through a mask or with the use of photolithographic techniques applied after the substrate has been sintered. However, during sintering the substrates may undergo a shrinkage of about 17%. This shrinkage can be accommodated by designing the unsintered substrates larger by the amount of the shrinkage. However, the shrinkage is not always uniform throughout the area of the substrate. Certain areas may shrink more or less resulting in a distorted pattern of vias on the surface. It may not be possible to align a screening mask or a mask exposing a resist to the pattern vias that must be connected to establish contact with the internal metallurgy of the substrate. The problem is further enhanced as the vias become smaller and the substrate becomes larger.

DISCLOSURE OF INVENTION

An object of this invention is to provide a process for forming a semiconductor package substrate having a conductive surface fan out pattern interconnected to an internal metallurgy pattern.

Another object is to provide a substrate having an I/O metallurgy pattern comprised of a conductive surface line pattern interconnected in combination with an internal metallurgy system.

Yet another object is to provide a process for forming a closely spaced terminal pattern for connecting to a semiconductor device and a fan out metallurgy pattern on a substrate that does not require closely spaced vias in the top sheet, and provides a positive and dependable mode of contacting the underlying internal metallurgy with a surface metallurgy pattern.

In accordance with the aforementioned objects, the process of the invention for forming a high density interconnection pattern on a ceramic substrate embodies providing an unsintered green ceramic substrate, forming indented lines in the surface of the ceramic substrate that defines the desired surface metallurgy pattern, sintering the ceramic substrate, depositing a substantially uniform metal layer of at least one metal over at least a portion of the surface of the ceramic substrate including the indented lines, applying a masking layer of material over the metal layer, which material of the masking layer is resistant to an etchant of the metal of the metal layer, removing portions of the masking layer overlying the metal layer areas on the flat surface of the ceramic substrate, but leaving intact the masking layer portions overlying the indented metal layer portions in the indented lines, exposing the top surface of the ceramic substrate to an etchant for the metal of the metal layer, thereby removing the exposed metal areas but leaving intact metal layer portions in the indented lines that are covered by the masking layer portions, and subsequently removing portions of the masking layer.

DESCRIPTION OF THE DRAWINGS

FIG. 1 is a flow chart illustrating the various steps of the method of this invention.

FIG. 2 is a top surface fragmentary view in greatly enlarged scale depicting the typical pattern of metallurgy that can be fabricated by the method of this invention.

FIGS. 3A and 3B collectively present a sequence of fragmentary cross-sectional views of a substrate illustrating the substrate at various stages of the method.

DESCRIPTION OF THE PREFERRED EMBODIMENT

Referring now to the drawings, there is illustrated in FIG. 1 a flow chart that depicts the novel combination of method steps of the invention for fabrication of a high density surface metallurgy system in a multi-layer ceramic substrate. Block 10 directs that an unsintered ceramic substrate be provided. The substrate is preferably formed of a mixture of particulate ceramic with a particle size in the range of 2 to 8 $\mu$m, a resin binder and a solvent for the binder, which substrate is subsequently sintered. The basic structure of the ceramic substrate, preferably a multi-layer ceramic substrate, is conventional, except for the several top layers that are normally used to fan out the electrical connections from the closely spaced pad pattern used to provide the interconnection to the device. In the ceramic substrate envisioned for use in this process, the upper layers can be completely deleted, or a lesser member of layers can be used to provide a portion of the fan out lines from the device pattern. If only a portion of the device pattern pads are associated with the internal fan-out pattern on the internal layers in the substrate, the number of via holes through the top sheet is decreased and they can be spaced further apart since the remaining pad contacts can be associated with the surface pattern which is produced by the process of this invention. Referring to FIG. 2, there is depicted multi-layer ceramic (MLC) substrate 30 having a cluster of I/O pads 32 with suitable metallurgy for establishing a contact to a semiconductor device. One or more rows of vias 34 surround the pad pattern 32. In a preferred specific embodiment the pad pattern 32 consists of a combination of surface pads 36 each associated with a via through the top layer, and interspersed pads 38 mounted on the top surface of the top level of the sheet. Pads 36 are interconnected to the internal metallurgy of the substrate by vias and metal stripes within the substrate. Pads 38 are interconnected to vias 34 by lines 40 on the surface to a via 34 that is in turn interconnected to the internal metallurgy. It is apparent that other alternative patterns can be fabricated using the process of the invention. For example, the entire set of closely spaced pads 32 can be mounted on the top surface of the substrate and the metallurgy fan out pattern be provided entirely of top surface lines. Vias 34 connected to the fan out pattern can alternatively be pins that extend entirely through the substrate if desired. A cross section of the MLC substrate 30 is illustrated in step A of FIG. 3A. Vias 37 beneath pad 36, which form part of the pattern 32 of contacts for joining to a device are connected to internal metallurgy by stripe 39.

The next step in the process is set forth in block 12 of FIG. 1, i.e. forming an indented pattern in the surface of substrate 30. This step is indicated in step B of FIG. 3A. An embossing die 41 provided with an embossed pattern 44 of the desired metallurgy pattern in a mirror image is pressed against the surface of substrate 30 forming an indented pattern of lines 40, and also indentations that define pads 36 over vias 37 leading to an internal fan out metallurgy system. The die can be produced by any suitable technique, as for example subtractive etching, sputter errosion and the like. The substrate 30 is preferably heated to soften the green ceramic sheet material of substrate 30, typically in the range of 75° to 95° C.

The shape, width and depth of the indentations 40 can be of any suitable dimensions consistent with the associated dimensions of the substrate 30. Preferably, the depth of the lines 40 and pad areas will be in the range of 0.5 to 2 mils. The width of the indented lines will preferably be in the range of 0.5 to 3 mils. Most preferably, the ratio of the width of the lines to the depth will be on the order of 1-3. As indicated in block 14 of FIG. 1, the substrate 30 is then sintered. During the sintering operation the substrate shrinks approximately 15 to 20% in both width and length. This shrinkage is indicated in step C of FIG. 3A. where the entire geometry of the substrate 32 is indicated as being smaller. Block 16 of FIG. 1 indicates that the next step is depositing a conductive metal layer over the surface of substrate 30 to a depth less than the depth of the embossed pattern of lines. Step E of FIG. 3B indicates the typical profile of metal layer 42. Note that the layer thickness is such that the depth in the indentation 40 is less than the height of the indentations. Since the substrate 30 has been sintered and therefore will not be subjected to any further high temperature steps, metal layer 42 can preferably be of a high conductivity metal such as copper, silver or the like. If necessary or desirable, the metal layer 42 can consist of a plurality of laminated or overlying layers of different types of metal. Selected areas of the substrate may be coated with a blanket of an additional metal, by blocking out the rest of the substrate temporarily during the deposition step with a metal mask or baffles. For example, a layer of gold may be deposited selectively on the areas which contain engineering change pads. The gold layer on these pads is used to connect wires for engineering changes. Layer 42 can be deposited by any suitable technique as for example, evaporation techniques, sputter deposition or the like. When the metal layer 42 is deposited by vaporization techniques, the source of metal should be relatively distant from the substrate and in a normal direction from the surface which will result in a relatively thin layer on the sidewalls of indentations 40 as shown most clearly in step E of FIG. 3B. The same effect can be achieved when using other deposition techniques such as settling of metal particles in a gravity field and sintering, or by similar techniques well known in the art.

As indicated in step F of FIG. 3B, a suitable masking layer of material 46 is applied over metal layer 42 in such a way that the recesses are filled but relatively little masking material remains on the raised areas. The masking material must be chosen so that it is resistant to the metal etchant which will subsequently be used to remove portions of the metal layer 42. For example, PR2011-4 Wornow Resist Paste produced by Dexter Corporation, Olean, N.Y. can be squeegeed over the surface of substrate 30. The mask resist layer 46 is then cured or dried as required. The resist on the raised area is subsequently removed, preferably by buffing with a fine sandpaper such as #600 grit silicon carbide grinding paper produced by Buehler Ltd., Evanston, Ill. that is backed by a resilient pad to accommodate any warpage of the sintered substrate. Alternately, the top portions of the layer 46 can be ablated by plasma ashing in a oxygen atmosphere. This will leave exposed the surfaces of metal layer 42 in all the areas except the indented lines and indented areas.

As indicated in block 22, the exposed metal areas of layer 42 are removed by a suitable etchant such as ammonium persulfate solution for copper. Sputter etching or reactive ion etching may also be used with a suitable resist material used as masking layer 46. The metal in the recesses or indentations is not attacked since it is protected by the remaining masking portions of layer 46. The metal in the recesses, i.e. indentations and depressed surface areas is not attacked since it is protected by the resist layer 46 on the top except for a narrow gap at the edges and by the ceramic walls on the sides.

As indicated in block 24 of FIG. 1, the remaining portions of layer 46 are removed by a suitable etchant for the mask material, leaving the metal layer 42 only in the indented lines and depressed pad areas of the substrate, which constitutes the desired conductive pattern. Any opens or shorts in the metallized pattern can be repaired with conductive paste, EC wires, or the metal pattern can be dissolved and reworked in extreme cases.

The surface metallurgy can be used to form suitable electrical connections to join devices with solder interconnections. The resultant surface metallurgy patterns produced by this method can be used to provide a metallurgy fan out pattern for the devices joined to the substrate or can supplement the fan out pattern provided internally of the substrate. A most important advantage is that the metallurgy pattern produced by the invention can be accurately used to interconnect vias in the substrate even though the substrate may shrink non-uniformly during sintering. This matching up of a mask for defining the same metallurgy pattern using photolithographic techniques is not possible when the substrate shrinks non-uniformly during sintering since the masking operation must be performed after the sintering operation has been complete.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A process for forming a top surface metallurgy pattern on a ceramic substrate comprising
   providing an unsintered green ceramic substrate,
   forming indented lines in the surface of the ceramic substrate that defines the desired surface metallurgy pattern,
   sintering the ceramic substrate,
   depositing a substantially uniform blanket metal layer of at least one metal over at least a portion of the surface of the ceramic substrate including said indented lines, the thickness of said metal layer being less than the depth of said indented lines, the metal being relatively thin on the side walls of the indented lines,
   applying a masking layer of material of a thickness in excess of the depth of said indented lines over the metal layer, which material of said masking layer is resistant to an etchant of the metal of the metal layer, and presents a relatively planar top surface,
   reducing the thickness of said masking layer by removing a relatively uniform layer portion from the surface, thereby exposing the metal layer portions that overlie the upper surface of said substrate, but leaving intact the masking layer portions overlying the metal layer portions in the indented lines,
   exposing the top surface of said ceramic substrate to an etchant for the metal of the metal layer thereby removing the exposed metal areas but leaving intact the metal layer portions in the indented lines that are covered by said masking layer portions, and
   removing the remaining portions of the masking layer.

2. The process of claim 1 wherein said green ceramic substrate is a laminated multi-layer substrate including an internal metallurgy system that includes metal filled vias that extend through at least the upper laminated sheet of the substrate, and
   said indented lines that define the desired surface metallurgy pattern being in alignment with and selectively overlying in part said metal filled vias.

3. The process of claim 2 wherein said indented lines that least define a fan-out metallurgy pattern for an I/O solder pad configuration for interconnecting a semiconductor device to the internal metallurgy system of said substrate.

4. The process of claim 3 wherein said fan-out metallurgy pattern of indented lines include enlarged areas defining engineering change pads.

5. The process of claim 2 wherein said internal metallurgy system is formed of a refractory metal selected from the group consisting of Mo, Ta and W, and mixtures thereof, and said surface metal layer is a high conductivity metal selected from the group consisting of Cu, Ag, Au, and alloys thereof.

6. The process of claim 3 wherein said indented lines include small unconnected areas overlying a single metal filled via, which unconnected area defines a power pad for powering the device to be connected thereto.

7. The process of claim 1 wherein said indented lines defining the surface metallurgy pattern is formed by heating the substrate to a temperature that softens the resin in the green ceramic material of the substrate, and an embossed die defining the desired surface metallurgy pattern is pressed against the top surface of the substrate.

8. The process of claim 1 wherein said temperature is at least the softening temperature of the resin used in the green ceramic material of the substrate.

9. The process of claim 8 wherein the green ceramic material of said substrate includes polyvinyl butyral resin material and said temperature is in the range of 75° to 95° C.

10. The process of claim 1 wherein the green ceramic material of said substrate includes alumina with an average particle diameter size in the range of 2 $\mu$m to 8 $\mu$m, and the width of said indented lines is approximately three times the diameter of the particles.

11. The process of claim 10 wherein the depth of said indented lines of said surface metallurgy pattern is in the range of 0.5 to 2 mils.

12. The process of claim 1 wherein said uniform metal layer is comprised of a plurality of metal layers.

13. The process of claim 12 wherein said metal layer is comprised of a first layer of Cr, a second intermediate relatively thick layer of Cu, and a thin overlying layer of Au.

14. The process of claim 1 wherein said metal layer is deposited by vapor deposition techniques, which leave a relatively thin layer of metal on the side walls of the indented pattern.

15. The process of claim 1 wherein said metal layer is deposited by gravity settling techniques, which leave a relatively thin layer of metal on the side walls of the indented pattern.

16. The process of claim 3 which further includes placing a block-out mask on the surface of said substrate having openings that expose the areas designated as I/O solder pads, depositing a relatively thick layer of solder on the block-out mask and through the openings on the substrate, and heating the substrate to re-form the deposited solder into I/O solder mounds.

17. The process of claim 4 which further includes placing a block-out mask on the surface of said substrate having openings that expose the areas designated as engineering change pads, and depositing a layer of Au on the block-out mask and through the openings on the substrate.

18. The process of claim 1 wherein the green ceramic material of said substrate is a glass-ceramic mixture having a coefficient of expansion that substantially matches the coefficient of expansion of Si, and a low sintering temperature that permits the use of non-refractory metals for the internal metallurgy system.

* * * * *